United States Patent [19]

Langlais

[11] 4,329,422

[45] May 11, 1982

[54] POST-EXPOSURE TREATING SOLUTION FOR PHOTOSENSITIVE GRAPHIC ARTS ARTICLES

[75] Inventor: Eugene L. Langlais, San Diego, Calif.

[73] Assignee: Napp Systems (USA), Inc., San Marcos, Calif.

[21] Appl. No.: 51,478

[22] Filed: Jun. 25, 1979

Related U.S. Application Data

[63] Continuation of Ser. No. 875,367, Feb. 6, 1978, abandoned.

[51] Int. Cl.$^3$ .......................... G03C 5/24; G03F 7/00
[52] U.S. Cl. ..................... 430/331; 430/149; 430/309; 430/493
[58] Field of Search ............... 430/331, 309, 493, 631, 430/638, 149

[56] References Cited

U.S. PATENT DOCUMENTS

| | | | |
|---|---|---|---|
| 2,354,979 | 8/1944 | Almy | 106/2 |
| 2,547,632 | 1/1951 | Nadeau et al. | 96/32 |
| 2,772,972 | 12/1956 | Herrick et al. | 96/75 |
| 2,780,168 | 2/1957 | Nichols | 101/149.2 |
| 3,257,941 | 6/1966 | Wolfson et al. | 106/2 |
| 3,289,577 | 1/1966 | Rauner | 106/2 |
| 3,398,002 | 8/1968 | Beedurnet | 106/2 |
| 3,501,522 | 3/1970 | Farah et al. | 260/505 |
| 3,592,640 | 7/1971 | Van Engeland | 96/1 |
| 3,595,653 | 7/1971 | Steppan et al. | 430/331 |
| 3,655,387 | 4/1972 | Collet et al. | 430/631 |
| 3,669,660 | 6/1972 | Golda | 96/49 |
| 3,696,746 | 10/1972 | Harper | 101/465 |
| 3,738,850 | 6/1973 | Radell et al. | 106/2 |
| 3,745,028 | 7/1973 | Rauner | 106/2 |
| 3,829,319 | 8/1974 | Suzuki et al. | 106/2 |
| 3,844,994 | 10/1974 | Vijayendran | 260/22 N |
| 3,891,438 | 6/1975 | Katz et al. | 96/49 |
| 3,891,439 | 6/1975 | Katz et al. | 430/331 |
| 4,013,008 | 3/1977 | Brown | 101/451 |
| 4,022,624 | 5/1977 | Miyamoto et al. | 106/2 |

*Primary Examiner*—Charles L. Bowers, Jr.
*Attorney, Agent, or Firm*—Hosier, Niro & Daleiden

[57] ABSTRACT

A desensitizing solution and process for using the solution are disclosed to desensitize a diazo photosensitive printing plate after development. The solution comprises a water soluble desensitizing agent capable of reacting with any residual photosensitive diazo on the developed plate to render the diazo incapable of forming an oleophilic substance and a filming agent selected from water soluble aliphatic polyols have less than eight carbon units, the acid derived monoesters of these polyols, and the alkali metal salts of the monoesters.

10 Claims, No Drawings

POST-EXPOSURE TREATING SOLUTION FOR PHOTOSENSITIVE GRAPHIC ARTS ARTICLES

This is a continuation of application Ser. No. 875,367 filed Feb 6, 1978 now abandoned.

BACKGROUND OF THE INVENTION

The present invention relates generally to the processing of photosensitive printing elements such as lithographic graphic arts plates. More particularly, the invention relates to a novel and highly efficacious desensitizing solution, and process for using the solution, to stabilize and protect diazo-sensitized elements in order to prevent the scumming, blinding and grease smudging phenomena commonly encountered with their use in lithographic printing processes.

Lithographic printing utilizes the immiscibility between oleophilic inks and an aqueous dampening fluid on a substantially planar printing plate surface. An oleophilic image area that corresponds to an image to be printed is formed on a plate and the remainder of the plate surface, the non-image area, is or is made hydrophilic in character. The image area accepts greasy ink and transfers the ink during printing; the non-image area is kept damp with water or an aqueous dampening fluid and repels the ink so that no printing occurs from that area. To form such a printing plate, a flat base surface is coated with a very thin layer of a light-sensitive material and exposed to light through a transparent film having opaque areas. A negative transparency of the image desired to be reproduced is used for exposing a so-called negative-acting plate, and a positive transparency is used for exposing a so-called positive-acting plate. Light passes through the clear areas of the negative transparency, which correspond to the image, and causes a reaction in the light-sensitive coating on the underlying plate that "hardens" the coating in the image area. Light does not pass through the opaque areas of the transparency, however, so that the light-sensitive coating on the plate underlying such areas remains unaffected. The plate is then developed by removing the coating from the plate in unexposed areas, which are hydrophilic, or are then made hydrophilic. The positive-acting plate differs from the negative-acting plate in that in the former the light passing through the clear areas of the positive transparency causes the light-sensitive coating on the underlying plate to decompose to some extent, thereby resulting in a solubility differential between image and non-image areas. The exposed areas of the positive-acting plate are removed. In either case, an oleophilic image area is formed on a plate having hydrophilic background areas.

It has also been known for some time that post development treatments of the printing plate may enhance the hydrophilicity of the background areas. Where diazo-sensitized plates have been used, the desensitizing solutions have generally comprised combinations of acids, gums and salts. The acids are employed to etch past any photosensitive or oleophilic residues left on the substrate, leaving a fresh surface with which the gums will react. These gums, generally very high molecular weight compositions, both physically and chemically adhere to the substrate. A variety of salts have been employed to enhance or aid the etching and/or gumming processes. Oftentimes a second gumming operation is performed to assure complete film formation over the background areas.

While these prior art desensitizing compositions and processes have met with considerable success, there are several disadvantages associated with their use which have limited their usefullness and acceptance in the industry and which necessitate a compromise of other desirable lithographic printing parameters. For example, most prior art desensitizing processes must be carefully controlled in order to assure complete desensitization in the background areas without causing "blinding", a condition where the gumming agent reduces the ink receptivity of the image areas. In addition, the acids used pose safety and environmental problems and tend to undercut image areas, thereby reducing the run time for a plate.

Another problem associated with prior art desensitizing systems, and one not previously recognized in the art, is the phenomena of "photo-blinding" which is related in some respects to the known phenomena of "photo-scumming". Photo-scumming is well known in the art. When a lithographic plate is incompletely desensitized and then re-exposed to actinic light, the background is no longer hydrophilic to the degree it was before re-exposing, thereby causing the plate to scum. Thus, the term "photo-scumming". On the other hand, a plate considered properly desensitized with conventional systems containing gums may often show decreased oleophilicity in image areas when re-exposed. Thus, even if the background area remains sufficiently hydrophilic on re-exposure the image may still "photo-blind". It is postulated that non-deactivated diazo in the image area reacts with the gum materials in a tanning or insolubilizing reaction, thereby yielding a slightly hydrophilic substance. Removing the gum from the formulation solves the problem on the image but renders the background sensitive. Removing the gumming agent from the desensitizer formulation eliminates photo-blinding on the image but, of course, results in incomplete desensitization in the background areas. Therefore, with conventional desensitizing systems prevention of photo-scumming causes photo-blinding and vice-versa.

Finally, even through the prior art desensitizers work reasonably well with plates having conventional aluminum substrates, their effectiveness is reduced when used on plates having an anodized aluminum substrate. Thus, scumming in the background areas is more predominant when anodized aluminum substrates are employed, even after a post development treatment with conventional gum desensitizers.

SUMMARY OF THE INVENTION

Accordingly, the present invention is directed to a novel desensitizing solution for use with diazo-sensitized lithographic plates which overcomes many of the disadvantages attendant to prior art desensitizing systems. The solution of the present invention is neither extremely acidic nor alkaline and is, therefore, relatively safe and ecologically acceptable. More importantly, the plate surface is not etched during processing, thereby avoiding any deterioration of the image areas. The desensitizing solution uses a low molecular weight film forming agent, rather than gums, and the problems of physical and photo blinding are thereby greatly reduced if not eliminated completely. The solution is equally efficacious on plain, silicated or even anodized aluminum substrates, and since the solution may be formulated and works effectively over a wide ph range, it can be tailored to accommodate specific diazo sensitizers which may be incompatible with either acids or bases. Finally, the desensitizing and film forming steps of the post development treatment are carried out simultaneously and no rinsing is required. Accordingly, a simple, one-step process is provided for completely desensitizing diazo lithographic plates.

The desensitizing solutions of the present invention generally comprise a desensitizing agent and a film forming agent. In addition, a surfactant may be utilized to enhance the efficacy of the treatment. The desensitizing agent must be water soluble and capable of reacting with residual photosensitive diazo adhering to the substrate to render the diazo incapable of forming oleophilic substances. The filming agent is also water soluble and forms a highly hydrophilic film over the diazo-freed substrate. The filming agent is a low molecular weight composition comprising aliphatic polyols with less than about 8 carbon atoms ($C<8$) and their water soluble, acid derived monoesters and monoester, alkali metal salts. The surfactant may be any of a number of well known nonionic surfactants so long as it is capable of remaining on the surface of the substrate without impairing the bonding of the filming agent.

In accordance with the process of the present invention, the novel desensitizing solution is applied by conventional techniques to a light activated diazo sensitized plate. The solution may be advantageously used as the developer in which case conventional developing techniques, such as mild abrasion or rubbing, will effectively break away the unexposed diazo to form the background areas. More conventionally, the solution will be applied to the plate after development. In either case the solution is allowed to react with the plate for sufficient time to desensitize the background areas, and then the plate is buffed dry. No rinsing or additional desensitizing operations are required.

DETAILED DESCRIPTION OF THE INVENTION

The present invention does not employ the conventional ingredients used in prior art desensitizing solutions. Rather novel desensitizing and filming agents are used which provide significant advantages in the processing of lithographic printing plates. Moreover, the combination of these novel ingredients results in a synergistic effect in that they will provide a degree of desensitization together, which neither can provide alone.

The desensitizing agent found to be effective in practicing the invention comprises a water soluble composition capable of reacting with photosensitive diazo to form a generally nonphotosensitive substance. While a great variety of such desensitizing agents are well known in the art, it has been found that certain water soluble aromatic acids and their salts are particularly efficacious. These compounds have the general formula:

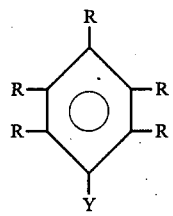

where "Y" corresponds to an acid group such as COOH, COOCl, $SO_3H$, $PO_3H$ and $BO_3H$, or the alkali metal or other water soluble salts of these acids. "R" may comprise one or more of many different elements or compounds, including hydrogen, aliphatic and aromatic hydrocarbons, halogens, or more complex structures such as azo groups. Actually in the broadest sense of the invention, the only limitation on the compounds combined with the basic aromatic acid is that the resulting composition retain its water solubility. Examples of the desensitizing agent found suitable for use in the present invention include: potassium and sodium salts of toluene sulfonic acid, sodium benzoate, cumene sulfonic acid, sodium and potassium salts of phenol sulfonic acid, sodium xylene sulfonate, potassium quiacol sulfonate, phenyl boronic acid, benzilic acid, benzene arsonic acid, p-amino phenyl sulfonic acid, p-hydroxy benzoic acid, anthroquinone disulfonic acid and its sodium salts and 4,5 dihydroxy m-benzene disulfonic acid.

In addition, the general formula may be modified by the addition of one or more active Y groups to the compound with equal or even increased densensitizing efficiency.

The operative concentration of the densensitizing agent is in the range of from about 2 to about 50 weight percent. Below this range even the most active densensitizer generally cannot completely deactivate the residual diazo compounds, while concentrations above about 50 percent result in potentially undesirable side reactions either within the solution itself or with the plate being treated. It has been found that concentrations of the desensitizing agent in the range of about 10 to about 25 weight percent are preferred. In this range total desensitizing is generally attainable while providing speed and allowing for the greatest latitude in processing techniques.

The filming agent of course, must be able to bond to the substrate, exhibit a high degree of hydrophilicity and form a film over the substrate without effectively hindering the ink receptive qualities of the image material. The film forming agent useful in the desensitizing solution of the present invention comprises a class of compounds heretofore unknown and unrecognized in the art as having any utility for these purposes within the graphic arts. This class includes low molecular weight aliphatic polyols with less than about eight carbon atoms and their water soluble, acid derived monoesters, and their monoester alkali metal salts. Preferred polyols are those whose which dry to a solid or semi-solid film, such as sorbitol, the sodium salt of sorbitol phosphate, sodium glycerol phosphate, and 1,6 hexanediol. Particularly preferred filming agents which have been found to synergistically combine with the desensitizing agents disclosed above include α and β glycerophosphate alkali metal salts. In addition, combinations of these polyols, ester acids and their salts may also be employed.

The operative concentration of filming agent is in the range of from about 5 to 60 weight percent. Below 5 percent a satisfactory film cannot develop, and concentrations above 60 percent result in an overly thick or viscous solution which is not practically useful in plate processing. Concentrations of filming agent in the range of from about 10 to about 30 weight percent are preferred since in this range a fully developed film is usually attainable while retaining optimum processing latitude.

As mentioned above, the desensitizing solution of the present invention may be formulated and is effective over a wide range of ph. For example, solutions have been found useful within the range of from about 3.0 to about 12.5. The preferred ranges of ph are from about 4.5 to about 6.0 and from about 8.0 to about 10.5. Below 3.0 and above 12.5 the solutions become too harsh and etching of both the substrate and image areas may occur, whereas in the preferred ranges the most complete and fastest desensitization is obtained.

Surfactants have also been found to assist the efficacy of the desensitizing treatment conducted in accord with the present invention. Although not necessary to the practice of the invention, the surfactants tend to speed the desensitization and help to provide a complete and uniform hydrophilic film. Useful surface active materials include most nonionic surfactants such as polyoxyethylated nonylphenols, and other well known surfactants commercially available under the Triton, Tergitol and Anterox trademarks. The surfactant is used in concentration from about 0.1 to about 10 percent by weight and in a conventional manner well known to those skilled in the art.

In preparing a desensitizing solution for use, the desensitizing agent is mixed and heated with water until complete dissolution is attained. This may require heating the mixture to as much as 150° F. for ½ hour up to about 2-3 hours, depending upon the particular desensitizer. Subsequently, the filming agent and surfactant, if any, are added, and the resulting solution is ready for use.

To desensitize a previously developed diazo plate, the solution is applied to the plate by conventional techniques, such as by brush or applicator pad, and allowed to stand until desensitization is complete. This generally occurs in about ½ to 2 minutes. The desensitized plate is then buffed dry and is ready for use on the printing machine. Alternatively, the desensitizing solution may be used as the developer—thus providing a truly one-step development. This procedure also allows greater latitude in the development area since there is no possibility of reacting residual active diazo with actinic light between the development and desensitizing processes.

The desensitizing solution of the present invention is useful for photosensitive plates utilizing diazo compounds as the light sensitive component and substrates which are capable of forming metal oxides. Thus, the solution will work well with conventional diazo plates having aluminum substrates, or other hydrophilic metal substrates such as zinc, magnesium and chromium. Moreover, use of the terms "diazo", "diazo type" or "diazo materials" herein refers to the full range of diazo or diazonium salts and the condensation resins derived from such salts which are eminently well known in the field of graphic arts.

The following examples further illustrate the invention, and all percentages referred to herein are by weight.

EXAMPLE I

A desensitizing solution was prepared by dissolving in water 20% sodium xylene sulfonate, 10% sorbitol and 0.2% Triton X-100. An aluminum plate, having been chemically grained, anodized and coated with a 2% solution of para diazo diphenylamine sulfate-para formaldehyde condensate, was imagewise exposed to actinic light, developed, then coated with the desensitizing solution and buffed dry. The plate was re-exposed to actinic light and then its printing characteristics evaluated. The plate exhibited neither photo-scumming nor photo-blinding. Another plate similarly treated except for the use of a conventional gum arabic/phosphoric acid desensitizer suffered from both photo-scumming and photo-blinding.

EXAMPLE II

The procedure of Example I was repeated using 10% toluene sulfonic acid as the desensitizer and 20% sodium glycerophosphate (SGP) as the filming agent. The resulting plate exhibited excellent hydrophilicity in the background areas and excellent oleophilicity in the image areas.

EXAMPLE III

The procedure of Example I was repeated using 20% potassium toluene sulfonate as the desensitizer, 20% SGP as the filming agent and 1% Triton X-100 as the surfactant. The resulting plate exhibited excellent hydrophilicity in the background areas and excellent oleophilicity in the image areas.

EXAMPLE IV

The procedure of Example I was repeated using 35% sodium benzoate as the desensitizer and 8% 1,6 hexanediol as the filming agent. The resulting plate exhibited excellent hydrophilicity in the background areas and excellent oleophilicity in the image areas.

EXAMPLE V

The procedure of Example I was repeated using 12% sodium sulfite as the desensitizer, 15% SGP as the filming agent and 0.5 ANTENOX BL-225 as the surfactant. The resulting plate exhibited excellent hydrophilicity in the background areas and excellent oleophilicity in the image areas.

EXAMPLE VI

The procedure of Example I was repeated on eight separate lithographic plates with the following desensitizing formulations:

|   | Desensitizing Agent | Filming Agent |
|---|---|---|
| A | 25% potassium toluene sulfonate | None |
| B | 15% potassium toluene sulfonate | None |
| C | 10% potassium toluene sulfonate | None |
| C' | 10% potassium toluene sulfonate | 10% SGP |
| D | 7% potassium toluene sulfonate | None |
| D' | 7% potassium toluene sulfonate | 15% SGP |
| E | None | 25% SGP |
| F | None | 50% SGP |

The plates were then re-exposed to actinic light and their printing characteristics evaluated on a lithographic printing press. The plates treated with solutions A and B exhibited neither photo-scumming nor photo-blinding, but were sensitive to grease smudging, such as fingerprints, and scratching which resulted in oleophilic characteristics in the background areas. The plates treated with solutions C, D, E and F were wholly unsatisfactory, exhibiting photo-scumming, photo-blinding and other undesirable printing phenomena. The plates treated with solutions C' and D' were satisfactory, exhibiting neither photo-scumming nor photo-blinding and resisting grease smudging and scratching.

As is evident from the foregoing examples, the desensitizing solution of the present invention is not only more effective than prior art desensitizing systems, but the disclosed desensitizing and filming agents also exhibit synerigistic results when combined in accordance with this disclosure.

Of course, it should be understood that various changes and modifications to the preferred embodiments described herein will be apparent to those skilled in the art. Such changes and modifications can be made without departing from the spirit and scope of the present invention and without diminishing its attendant advantages. It is, therefore, intended that such changes and modifications be covered by the following claims.

I claim:

1. A post-exposure treating solution for photosensitive graphic arts articles comprising:
   (a) from 2 to about 50 weight percent of a compound having the formula

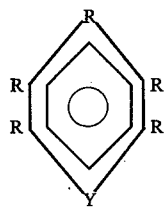

where Y is an acid group or a water soluble salt of said acid group and where R is another Y, hydrogen, an aliphatic hydrocarbon; and
   (b) about 5 to 60 weight percent of a film forming compound having fewer than 8 carbon atoms and selected from the group comprising the water-soluble mono-ester alkali metal salts of sorbitol phosphate and the alkali metal salts of α and β glycerophosphate; and
   (c) sufficient water to make 100 weight percent of solution.

2. The solution of claim 1 wherein compound (a) is selected from the group comprising potassium and sodium salts of toluene sulfonic acid, sodium benzoate cumene sulfonic acid, sodium and potassium salts of phenol sulfonic acid, sodium xylene sulfonate, potassium quiacol sulfonate, phenyl boronic acid, benzilic acid, benzene arsonic acid, p-amino phenyl sulfonic acid, p-hydroxy benzoic acid, potassium and sodium salts of p-amino benzoic acid, anthroquinone disulfonic acid and its sodium salts and 4,5 dehydroxy m-benzene disulfonic acid.

3. The solution of claim 1 wherein compound (a) comprises from about ten to about twenty-five percent of the solution by weight.

4. The solution of claim 1 wherein said solution has a ph in the range of from about 3 to about 12.5.

5. The solution of claim 1 further comprising a non-ionic surfactant.

6. The solution of claim 1 further comprising a non-ionic surfactant from about 0.1 to about 10 percent of the solution by weight.

7. The treating solution of claim 1 wherein compound (b) comprises from about ten to about thirty percent of the solution by weight.

8. A post-exposure treating solution for developing or desensitizing photosensitive graphic arts articles consisting essentially of:
   (a) from 2 to about 50 weight percent of a compound having the formula

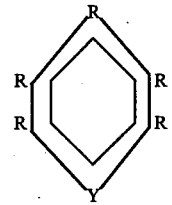

where Y is an acid group or a water soluble salt of said acid group and where R is another Y, hydrogen, an aliphatic hydrocarbon or an aromatic hydrocarbon; and
   (b) about 5 to 60 weight percent of a compound having fewer than 8 carbon units and selected from the group comprising the water-soluble mono-ester alkali metal salts of sorbital phosphate and the alkali metal salts of α and β glycerophosphate; and
   (c) sufficient water to make 100 weight percent of solution.

9. The solution of claim 8 wherein compound (a) is selected from the group comprising potassium and sodium salts of toluene sulfonic acid, sodium benzoate cumene sulfonic acid, sodium potassium salts of phenol sulfonic acid, sodium xylene sulfonate, potassium quiacol sulfonate, phenyl boronic acid, benzilic acid, benzene arsonic acid, p-amino phenyl sulfonic acid, p-hydroxy benzoic acid, potassium and sodium salts of p-amino phenyl sulfonic acid, p-hydroxy benzoic acid, potassium and sodium salts of p-amino benzoic acid, anthraquinone disulfonic acid and its sodium salts and 4,5 dihydroxy m-benzene disulfonic acid.

10. The solution of claim 8 further including as a separate ingredient a non-ionic surfactant.

* * * * *

UNITED STATES PATENT AND TRADEMARK OFFICE
CERTIFICATE OF CORRECTION

PATENT NO. : 4,329,422
DATED : May 11, 1982
INVENTOR(S) : Eugene L. Langlais

It is certified that error appears in the above—identified patent and that said Letters Patent is hereby corrected as shown below:

In claim 1, the formula should appear as follows:

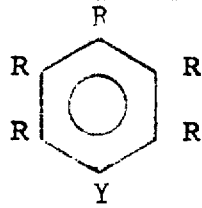

In claim 8, the formula should appear as follows:

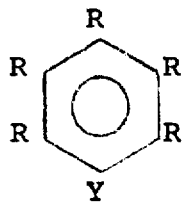

Signed and Sealed this

Twenty-first Day of September 1982

[SEAL]

Attest:

GERALD J. MOSSINGHOFF

Attesting Officer

Commissioner of Patents and Trademarks